(12) United States Patent
Hara

(10) Patent No.: US 6,433,390 B1
(45) Date of Patent: Aug. 13, 2002

(54) BONDED SUBSTRATE STRUCTURES AND METHOD FOR FABRICATING BONDED SUBSTRATE STRUCTURES

(75) Inventor: Masaki Hara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/625,475

(22) Filed: Jul. 25, 2000

(30) Foreign Application Priority Data

Jul. 26, 1999 (JP) .......................................... 11-210403

(51) Int. Cl.⁷ .............................................. H01L 27/01
(52) U.S. Cl. ..................................................... 257/347
(58) Field of Search ................................ 257/347–354, 257/507, 98; 438/52, 455, 459, 460, 974, 977; 353/30, 31, 97–99; 359/196, 223, 224, 280, 290–292, 295, 298, 846, 855, 900

(56) References Cited

U.S. PATENT DOCUMENTS

| | | | |
|---|---|---|---|
| 5,085,497 A | * | 2/1992 | Um et al. .................... 359/848 |
| 5,557,695 A | * | 9/1996 | Yamana et al. ................ 385/49 |
| 6,094,294 A | * | 7/2000 | Yokoyama et al. ......... 359/290 |
| 6,200,882 B1 | * | 3/2001 | Drake et al. ................ 438/464 |
| 6,201,629 B1 | * | 3/2001 | McCelland et al. ......... 359/223 |

* cited by examiner

Primary Examiner—Michael J. Sherry
Assistant Examiner—Asok Kumar Sarkar
(74) Attorney, Agent, or Firm—Sonnenschein, Nath & Rosenthal

(57) ABSTRACT

In fabricating bonded substrate structures having a device-housing space therein, microstructures in the bonded substrates are prevented from being broken or damaged, and the yield of the bonded substrate structures fabricated is increased. A through-groove capable of connecting the device-housing space to the outside is formed in the bonded surface of one substrate. Thus configured, the atmosphere inside the device-housing space is kept the same as the outside atmosphere while openings that reach the device-housing space are formed through the bonded substrate structure by etching the structure, and the device-housing space is prevented from being subjected to any rapid pressure change in the process of forming the openings. The depth of the through-groove may be the same as that of the recess for the device-housing space. Thus configured, the through-groove may be formed in one and the same etching treatment for forming the device-housing space. The through-groove may be partly sealed with a Pb bump or the like, and the atmosphere inside the device-housing space can be insulated from the outside atmosphere in any stage of processing the bonded substrate structure.

16 Claims, 12 Drawing Sheets

BONDED SUBSTRATE STRUCTURES AND METHOD FOR FABRICATING BONDED SUBSTRATE STRUCTURES

BACKGROUND OF THE INVENTION

1. Field of the Invention

The present invention relates to bonded substrate structures and to a method for fabricating bonded substrate structures. For example, the invention relates to bonded substrate structures with a plurality of substrates being bonded together, including those with a glass substrate bonded to a semiconductor substrate and those with a plurality of different semiconductor substrates bonded together, and relates to a method for fabricating such bonded substrate structures. In particular, the technique of the invention is suitable to bonded substrate structures with a glass substrate bonded to a semiconductor substrate, and to a bonding method for fabricating such bonded substrate structures. The bonded substrate structures and the bonding method for them of the invention are especially useful in the field of MEMS (micro-electro-mechanical systems).

2. Description of the Related Art

In the field of semiconductors, much used are bonded substrate structures with a plurality of substrates being bonded together, including, for example, those with a glass substrate bonded to a semiconductor substrate and those with a plurality of different semiconductor substrates bonded together. For example, known is a bonded substrate structure with a glass substrate bonded to a semiconductor substrate, in which various devices are housed in device-housing recesses formed in the glass substrate and the recesses are covered and sealed with the semiconductor substrate. Another bonded substrate structure is also known, in which movable devices such as mirrors, lenses and the like are fitted to the upper layer substrate and devices for driving the movable devices are fitted to the lower layer substrate.

A micro-mirror device is one example of a bonded substrate structure with a semiconductor substrate bonded to a glass substrate. FIGS. 1A and 1B show an ordinary micro-mirror device structure. In such a micro-mirror device, the mirror angle is variable, and a voltage is applied to the driving electrode housed in the device-housing recess formed in the glass substrate thereby to drive the mirror movably fitted to the semiconductor substrate.

FIGS. 1A and 1B are referred to, which show the structure of such a micro-mirror device. Precisely, FIG. 1A is an outline view of a micro-mirror device; and FIG. 1B is an exploded view thereof in which the upper semiconductor substrate is separated from the lower glass substrate. As in FIGS. 1A and 1B, the micro-mirror device comprises a semiconductor substrate 101 and a glass substrate 102. As therein, a mirror 104 is fitted to the semiconductor substrate 101. The mirror 104 is supported by beams 105 at the facing two corners, and its angle is variable around the pivotal axis of each beam 105. The electrode for driving the mirror 104 is formed in the device-housing recess of the glass substrate 102. Various devices are housed in the device-housing recess 103. After the devices to be in the device-housing recess 103 have been formed, the glass substrate 102 is bonded to the semiconductor substrate 101.

FIGS. 2A to 2E show a process of fabricating such micro-mirror devices. In the process illustrated, a plurality of micro-mirror devices are formed on one laminate substrate composed of a semiconductor substrate and a glass substrate and having a size of 20 mm×20 mm, and these are finally cut into individual devices.

As in FIG. 2A, a glass substrate 202 with a mirror-driving electrode and other devices having been formed in each device-housing recess 203 is bonded to a semiconductor substrate 201 of silicon. For bonding them, for example, the two substrates are subjected to anodic bonding at 300 to 400° C. and at a voltage falling between 0.5 and 1.0 kV.

After the two substrates are thus bonded together, an Al film 204 for mirrors is formed on the Si substrate 201 through vapor deposition, as in FIG. 2B. Next, a resist pattern 206 for mirrors is formed, as in FIG. 2C. This is put into a solution of, for example, phosphoric acid, by which the Al film 204 except the area below the resist pattern is removed to give resist-coated mirrors, as in FIG. 2D. Next, the resist film is removed to form mirrors, as in FIG. 2E. The process does not interfere with the devices in the glass substrate 202.

In order that the mirror in each device thus formed is supported by two beams, as in FIGS. 1A and 1B, the area around the mirror must be etched away, for example, through dry etching. Dry etching shall be effected in a vacuum of from a few mTorr to tens mTorr.

The glass substrate 202 is bonded to the Si substrate 201, for example, through anodic bonding as in the above. In case where they are bonded in that manner at an atmospheric pressure, a vapor of around 0.4 atmospheres will be sealed in the device-housing recesses 203 in the glass substrate 202. Accordingly, when the area around the mirrors is etched in dry in a vacuum falling between a few mTorr and tens mTorr, the gas remaining in the sealed device-housing recesses 203 will jet out at a high speed immediately after the Si substrate around the mirrors has been removed to give through-grooves reaching the device-housing recesses 203. As a result, the fine structures formed in the device-housing recesses 203 and even the mirror-supporting beams will be broken or damaged.

To prevent the gas from jetting out of the sealed device-housing space in the dry-etching process as above, employable is a method of forming openings running outside through any one of the glass substrate and the semiconductor substrate in the direction of their depth before the two substrates are bonded together. In the bonded substrate structure formed in the method, gas is not sealed in the device-housing space but could pass through the openings formed. Another method employable for that purpose comprises bonding the two substrates in vacuum. In this, the sealed device-housing recesses 203 in the glass substrate 202 are kept in vacuum before the substrate 202 is bonded to the other semiconductor substrate.

FIGS. 3A to 3C show a process for fabricating a micro-mirror device, in which openings are formed through the semiconductor substrate so as to prevent gas ejection from the sealed device-housing recesses. These is to typically illustrate the process of fabricating one micro-mirror device.

In the process of FIGS. 3A to 3C, a glass substrate 302 with a device-housing recess 303 formed therein is bonded to a semiconductor substrate 301. For example, they are bonded together through anodic bonding at 300 to 400° C. under atmospheric pressure, like in the manner mentioned above. As in FIG. 3A, openings 309 are first formed in the region 308 to be etched (this is surrounded by the dotted line), around the mirror-forming region 307.

Next, the glass substrate 302 is bonded to the semiconductor substrate 302 through anodic bonding, as in FIG. 3B.

Finally, the region 308 to be etched (surrounded by the dotted line in FIG. 3A) is etched in dry to finish the structure of FIG. 3C in which the mirror 304 is supported by beams 305. The dry etching is effected in a vacuum falling between a few mTorr and tens mTorr. In this process, since the device-housing space 303 is open to the outside through the openings 309, the pressure inside it could be kept the same as that outside it with no rapid pressure change during the etching step.

However, the method for preventing rapid pressure change in the device-housing space by forming openings running outside through any one of the glass substrate and the semiconductor substrate in the direction of their depth before the two substrates are bonded together, as in FIGS. 3A to 3C, requires the additional step of forming the openings. For example, it additionally requires resist patterning and dry-etching for forming the openings. As being so complicated, the method is therefore unfavorable. In addition, the strength of the substrate thus having such a plurality of openings therein is lowered, and the substrate will be broken or damaged in the bonding step or in the step before or after the bonding step. On the other hand, if the cross-sectional area of the openings is reduced so that it does not occupy any superfluous region and that the openings do not lower the strength of the substrate, the aspect ratio of the openings shall be large and it is difficult to form the openings having such a large aspect ratio.

Regarding the other method of bonding the semiconductor substrate and the glass substrate to each other in vacuum, the step of increasing the degree of vacuum in every closed device-housing space in the center region of one wafer having a number of devices therein will take a lot of time, thereby lowering the production efficiency.

SUMMARY OF THE INVENTION

In consideration of the problems with the related art techniques noted above, the present invention is to provide bonded substrate structures with a plurality of substrates being bonded together and a method for fabricating such bonded substrate structures with no rapid pressure change in the step of forming a device-housing space in the structures. Specifically, in the method of fabricating bonded substrate structures of the invention, the device in the structures is not broken or damaged in any stage of bonding the substrates or etching them to form a through-groove therein, and the method itself is not complicated.

The bonded substrate structures and the method for fabricating them of the invention are especially effective in the field of MEMS (micro-electro-mechanical systems).

The invention has been made in consideration of the problems noted above, and its first aspect is to provide a bonded substrate structure with a plurality of substrates being bonded together, in which at least one bonded substrate is so constituted that its bonded surface has a through-groove running inwardly from its peripheral edge.

In one embodiment of the bonded substrate structure of the invention, the through-groove reaches a device-housing recess formed in at least one bonded substrate and is open thereto so that the atmosphere outside the bonded substrate structure can be kept nearly the same as the atmosphere inside the device-housing recess via the through-groove.

In another embodiment of the bonded substrate structure of the invention, the bonded surface of at least one substrate has a device-housing recess and the through-groove, and the device-housing recess and the through-groove have nearly the same depth.

In still another embodiment of the bonded substrate structure of the invention, at least one bonded substrate has a plurality of device-housing recesses corresponding to a plurality of devices, the through-groove is configured to comprise a plurality of through-grooves connecting the device-housing recesses to each other, and the through-grooves formed inside the bonded substrate and remoter from the peripheral edge thereof are made to have a larger conductance for the fluid running therethrough than those formed adjacent to the peripheral edge of the bonded substrate.

In still another embodiment of the bonded substrate structure of the invention, the cross-sectional area of the through-grooves formed inside the bonded substrate is made larger than that of the through-grooves formed adjacent to the peripheral edge of the bonded substrate to thereby adjust the conductance of the through-grooves for the fluid running through them.

In still another embodiment of the bonded substrate structure of the invention, the number of the through-grooves formed inside the bonded substrate is made larger than that of the through-grooves formed adjacent to the peripheral edge of the bonded substrate to thereby adjust the conductance of the through-grooves for the fluid running through them.

In still another embodiment of the bonded substrate structure of the invention, the width of the through-grooves formed inside the bonded substrate is made larger than that of the through-grooves formed adjacent to the peripheral edge of the bonded substrate to thereby adjust the conductance of the through-grooves for the fluid running through them.

In still another embodiment of the bonded substrate structure of the invention, the depth of the through-grooves formed inside the bonded substrate is made larger than that of the through-grooves formed adjacent to the peripheral edge of the bonded substrate to thereby adjust the conductance of the through-grooves for the fluid running through them.

In still another embodiment of the bonded substrate structure of the invention, the through-groove is connected to the device-housing recess formed in at least one bonded substrate, and has therein a sealing member that insulates the device-housing recess from the outside to keep it sealed.

In still another embodiment of the bonded substrate structure of the invention, the sealing member is formed by melting a sealing substance in the through-groove or on the surface opposite to the through-groove.

In still another embodiment of the bonded substrate structure of the invention, the sealing member in the through-groove is provided with a pad member having high wettability with the sealing substance, and the sealing substance is, when melted, aggregated in the area of the high-wettability pad member to block the through-groove.

In still another embodiment of the bonded substrate structure of the invention, the sealing substance is lead.

In still another embodiment of the bonded substrate structure of the invention, the sealing substance is any of a metal, an alloy or a resin.

In still another embodiment of the bonded substrate structure of the invention, only one sealing member is formed in one through-groove.

In still another embodiment of the bonded substrate structure of the invention, a plurality of sealing members are formed in one through-groove while being spaced from each other therein.

One specific embodiment of the bonded substrate structure of the invention is a micro-mirror device having a movable mirror supported by one substrate by means of beams and having, on the other substrate, an electrode for driving the movable mirror.

The second aspect of the invention is to provide a method for fabricating a bonded substrate structure with a plurality of substrates being bonded together, which comprises a step of forming, in at least one substrate to be bonded, a through-groove that runs outside from a device-housing recess formed in the substrate to thereby connect the recess to the outside, followed by bonding the substrate to another substrate, and a step of forming, in a vacuum atmosphere, an opening that passes through the surface of one bonded substrate to the device-housing recess.

The third aspect of the invention is to provide a method for fabricating a bonded substrate structure with a plurality of substrates being bonded together, which comprises a step of forming a device-housing recess in at least one substrate to be bonded, and in which the treatment for forming the device-housing recess in the step is combined with a treatment for forming a through-groove that connects the device-housing recess to the outside.

In one embodiment of the method of the invention, the step of forming the device-housing recess is for an etching treatment, and the treatment for forming the device-housing recess and the through-groove so as to make them have the same depth is effected in one and the same etching step.

The fourth aspect of the invention is to provide a method for fabricating a bonded substrate structure with a plurality of substrates being bonded together, which comprises a step of forming, in at least one substrate to be bonded, a through-groove that runs outside from a device-housing recess formed in the substrate to thereby connect the recess to the outside, followed by bonding the substrate to another substrate, a step of blocking the end of the through-groove at the edge of the bonded substrates, and a step of processing the surface of the bonded substrates.

In one embodiment of the method of the invention, the step of blocking the end of the through-groove is effected by forming a resist film.

The fifth aspect of the invention is to provide a method for fabricating a bonded substrate structure with a plurality of substrates being bonded together, which comprises a step of forming, in at least one substrate to be bonded, a through-groove that runs outside from a device-housing recess formed in the substrate to thereby connect the recess to the outside, followed by bonding the substrate to another substrate, and a step of sealing the through-groove by melting a sealing substance having been fitted to at least any of the through-groove or the surface opposite to the through-groove.

In one embodiment of the method of the invention, the sealing substance is a low-melting-point material, a pad member having high wettability with the sealing substance is formed adjacent to the through-groove, and the sealing substance is, when melted, aggregated in the area of the high-wettability pad member to block the through-groove.

DESCRIPTION OF PREFERRED EMBODIMENTS OF THE INVENTION

Preferred embodiments of the bonded substrate structures and the method for fabricating them of the invention are described with reference to the drawings.

Embodiment 1

Embodiment 1 of the invention is described. This is to demonstrate a bonded substrate structure with grooves formed in the surface of the bonded substrate, in which the grooves connect device-housing recesses formed in the substrate to the outside.

Figure 1B:
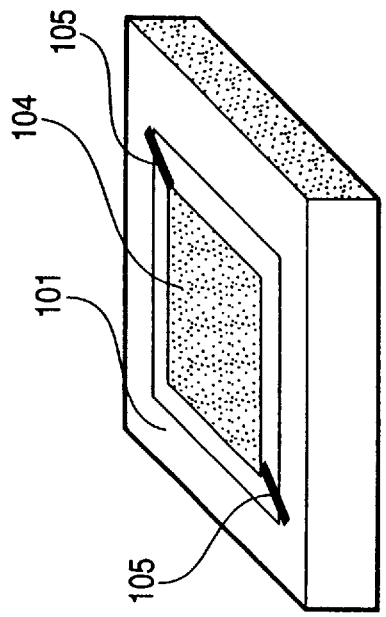
FIGS. 1A, 1B and 1C are views showing the constitution of a micro-mirror device.
Figure 1C:
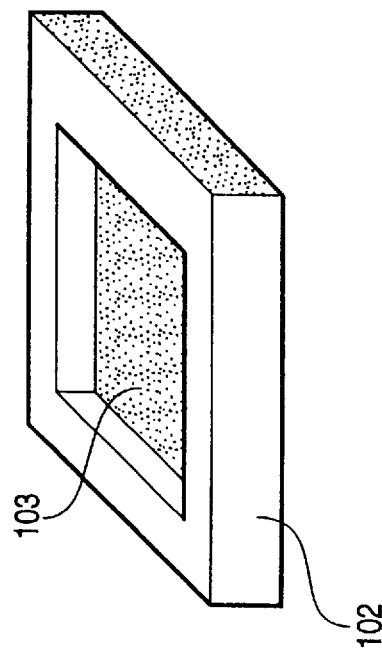
Figure 1A:
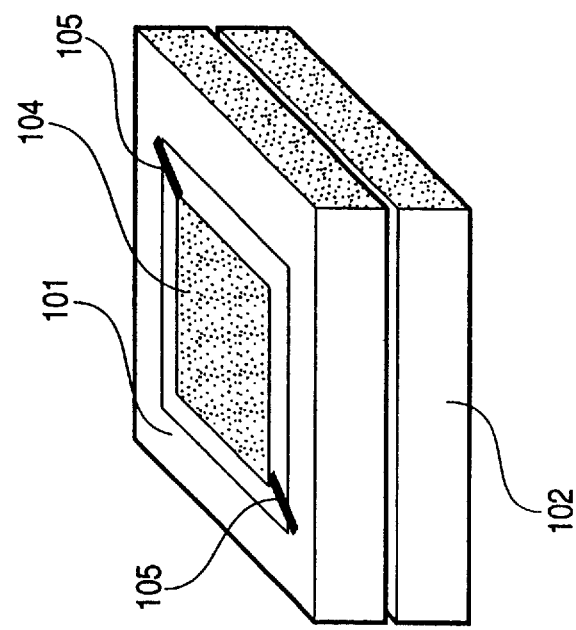
Figure 2A:
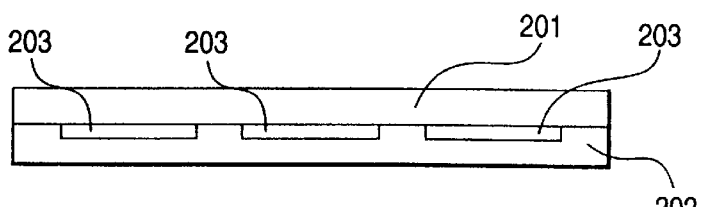
FIGS. 2A to 2E are views showing a process for fabricating micro-mirror devices.
Figure 2B:
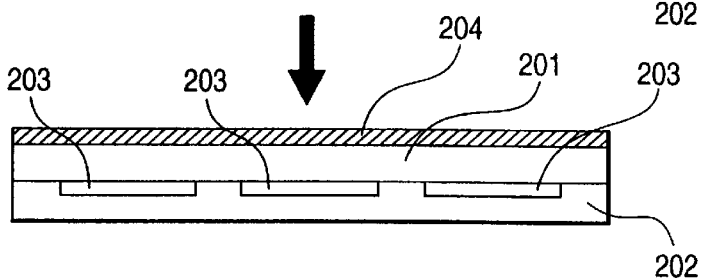
Figure 2C:
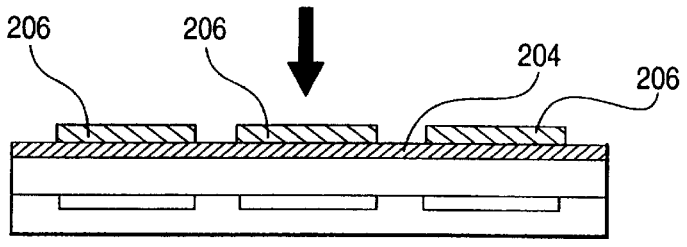
Figure 2D:
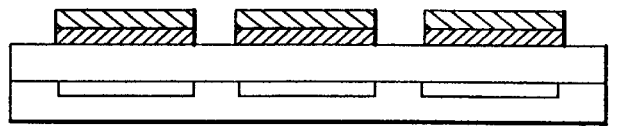
Figure 2E:
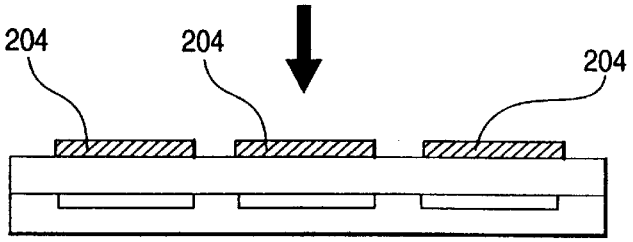
Figure 3A:
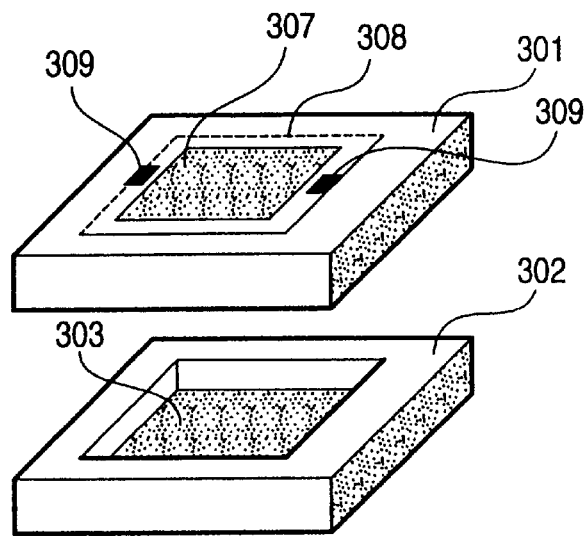
FIGS. 3A to 3C are views showing a process for fabricating micro-mirror devices, for which is used a conventional bonded substrate structure having perpendicular openings.
Figure 3B:
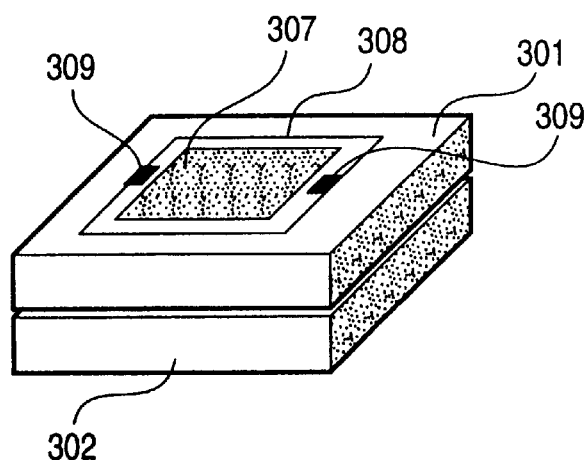
Figure 3C:
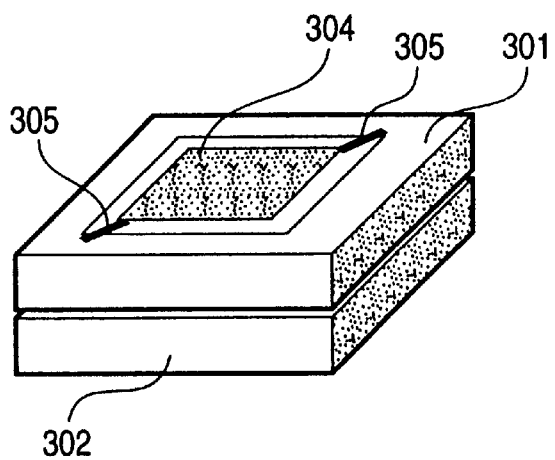
Figure 4A:
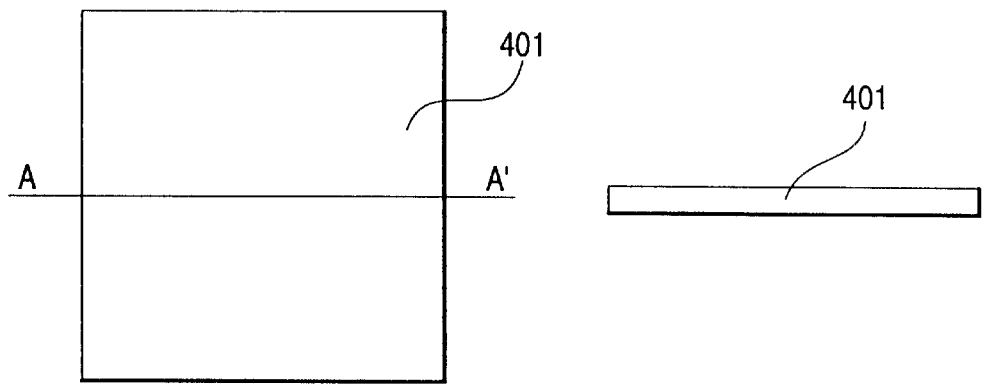
FIGS. 4A to 4C are views for explaining the constitution of the first embodiment of the invention.
Figure 4B:
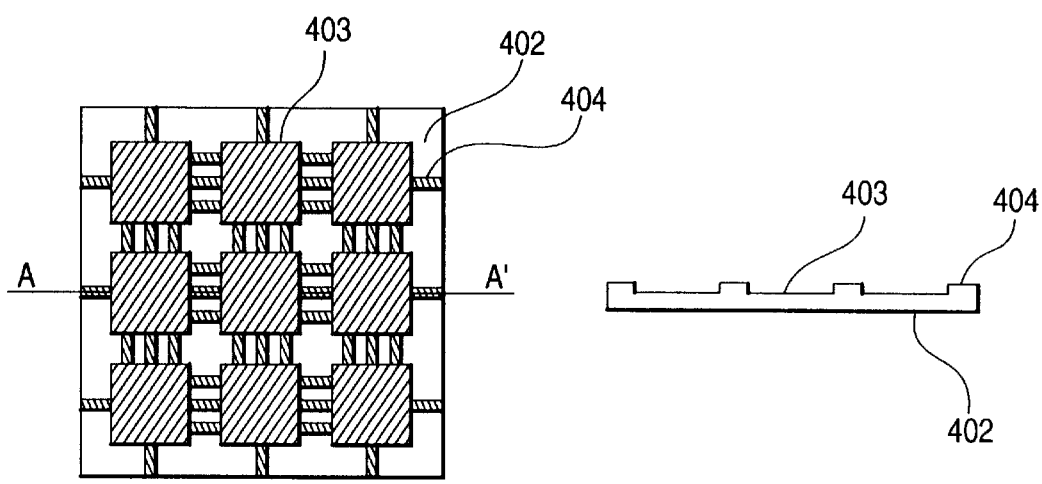
Figure 4C:
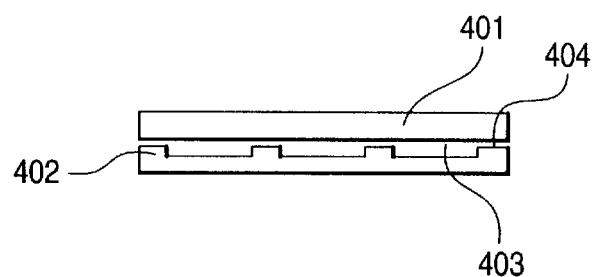

FIGS. 4A to 4C are views for explaining the constitution of this embodiment. Briefly, FIG. 4A shows a plan view of the upper substrate to be bonded, and a cross-sectional view thereof. FIG. 4B shows a plan view of the lower substrate to be bonded, and a cross-sectional view thereof. FIG. 4C is a cross-sectional view of the bonded substrate structure with the upper substrate having been bonded to the lower substrate. To give the cross-sectional views as in FIG. 4A and FIG. 4B, the corresponding plan views therein are cut along the line A–A'. To give the cross-sectional view of FIG. 4C, the bonded substrate structure with the upper substrate having been bonded to the lower substrate is cut along the same line A–A'.

The constitution of this embodiment shown in FIGS. 4A to 4C is applicable to micro-mirror devices such as those described hereinabove with reference to the related art technology, but is not limited thereto. The bonded substrate structures and the method for fabricating them of the invention are applicable not only to micro-mirror devices but also to other various devices generally having the constitution of bonded substrate structures.

In FIG. 4A, the upper substrate 401 is an upper Si substrate of the two substrates to be bonded together. Both surfaces of the upper Si substrate 401 are polished, and the substrate has a size of 40 mm×40 mm×60 $\mu$m (thickness).

In FIG. 4B, the lower substrate 402 is a Pyrex glass substrate having a size of 40 mm×40 mm×200 μm (thickness). In the lower Pyrex glass substrate 402, formed are a plurality of device-housing recesses 403, and each recess houses a device. Finally, the device blocks are separated into individual ones, and each device block will function as one micro-mirror device. In the embodiment illustrated in FIGS. 4A to 4C, the bonded substrate structure has 3×3=9 device blocks in total. The number of the device blocks to be formed in one substrate shall vary, depending on the necessary area of each device block and the area of the substrate. As the case may be, more device blocks could be formed in the bonded substrate structure.

In the embodiment shown in FIGS. 4A to 4C, nine device-housing recesses 403 each having a size of 10 mm×10 mm×20 μm (depth) are formed in the lower Pyrex glass substrate 402 having a size of 40 mm×40 mm×200 μm (thickness), through anisotropic dry etching with $CF_4$ gas. In each device-housing recess 403, formed is an Al electrode (not shown) for driving a micro-mirror.

In the lower substrate 402, through-grooves 404 that characterize the invention are formed in the area in which they connect the device-housing recesses 403 to each other and in the area in which they run to the edge of the substrate. The through-grooves 404 are formed, for example, through isotropic wet etching with a solution of HF, each having a length of 2.5 mm, a width of 30 μm and a maximum depth of 10 μm.

In this embodiment, one through-groove 404 is formed between one device-housing recess 403 and one edge of the lower substrate 402 to connect them, and three through-grooves 404 are formed between the adjacent two device-housing recesses 403 to connect them, as in FIG. 4B.

The upper Si substrate 401 shown in FIG. 4A is aligned relative to the lower Pyrex glass substrate 402 shown in FIG. 4B, and they are bonded through anodic bonding to each other.

FIG. 4C is a cross-sectional view showing the anodically-bonded substrate structure. The cross-sectional view of FIG. 4C shows the center region of the bonded substrate structure, corresponding to the A–A' cross section in FIGS. 4A and 4B. In this, the device-housing recesses 403 and the through-grooves 404 are in line.

As is understood from the cross-sectional view of FIG. 4C, the three device-housing recesses 403 are all connected to each other by the through-grooves therebetween, and are therefore kept connected to the outside. Though FIG. 4C shows only the center-crossing area of the bonded substrate structure, it is easy to understand that all the nine device-housing recesses 403 shown in FIG. 4B are connected to the outside via the through-grooves 404.

With the through-grooves 404 configured in the manner illustrated, all the device-housing recesses 403 existing in the lower substrate 402 are kept connected to the outside. Therefore, the atmosphere inside the device-housing recesses 403 is kept the same as the outside atmosphere.

Accordingly, for example, in case where the upper Si substrate 401 is aligned relative to the lower Pyrex glass substrate 402 and then bonded thereto through anodic bonding at 300 to 400° C. under atmospheric pressure with a voltage of from 0.5 to 1.0 kV being applied to them, and thereafter the region of the upper Si semiconductor substrate around the mirrors fitted thereto is etched away, the substrates and the beams will not be broken or damaged even when the etching treatment is effected in dry in a vacuum falling between a few mTorr and tens mTorr. This is because the device-housing recesses 403 are connected to the outside via the through-grooves 404 therebetween, and therefore the space of the device-housing recesses 403 is kept having an atmosphere which is the same as the outside atmosphere, or that is, kept having a pressure which is nearly the same as the outside pressure. In that condition, there will be no rapid pressure change in the device-housing recesses 403 even when the recesses are exposed to the etching environment in vacuum.

Figure 5:
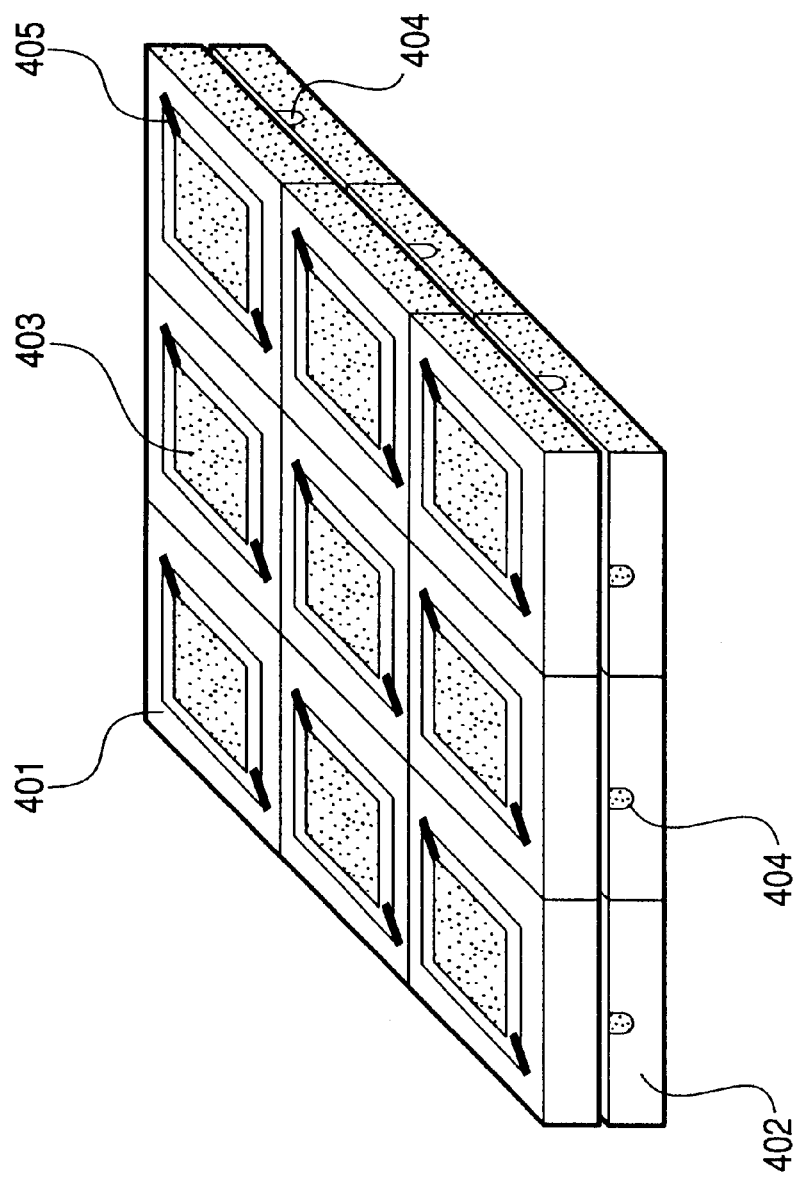
FIG. 5 is a view showing the bonded substrate structure of the first embodiment of the invention, which is formed into a micro-mirror device.

FIG. 5 is a view showing the bonded substrate structure of this embodiment, with micro-mirror devices being formed on the upper Si substrate 401. As in FIG. 5, the upper substrate 401 is bonded to the lower substrate 402, and the through-grooves 404 are formed in the lower substrate in such a manner that they are open to the outside as in FIG. 4B. Though not shown in FIG. 5, the nine device-housing recesses are all connected to each other via the through-grooves 404 inside the structure.

In case where the upper Si substrate 401 of the bonded substrate structure is subjected to deep Si RIE (reactive ion etching) to form the configuration of micro-mirrors supported by two beams 405, the fine pattern of the beams formed will not be broken or damaged even when the etching treatment is effected in a vacuum atmosphere falling, for example, between a few mTorr and tens mTorr. This is because the atmosphere inside the nine device-housing recesses all can be kept the same as the vacuum atmosphere in the RIE chamber, and therefore, even when openings that run from the surface of the Si substrate to the inside of the device-housing recesses are formed through RIE, there will be no danger of gas ejection from the recesses through the openings just having been formed.

In this embodiment, one through-groove 404 is formed between one device-housing recess 403 and one edge of the lower substrate 402 to connect them, and three through-grooves 404 are formed between the adjacent two device-housing recesses 403 to connect them, as in FIG. 4B. This configuration is for reducing the conductance for the fluid running therethrough of the through-grooves 404 that connect the device-housing recesses 403 formed inside the bonded substrate and remoter from the peripheral edge of the bonded substrate, to thereby remove the pressure difference between the inner space of the recesses and the outside.

Figure 6A:
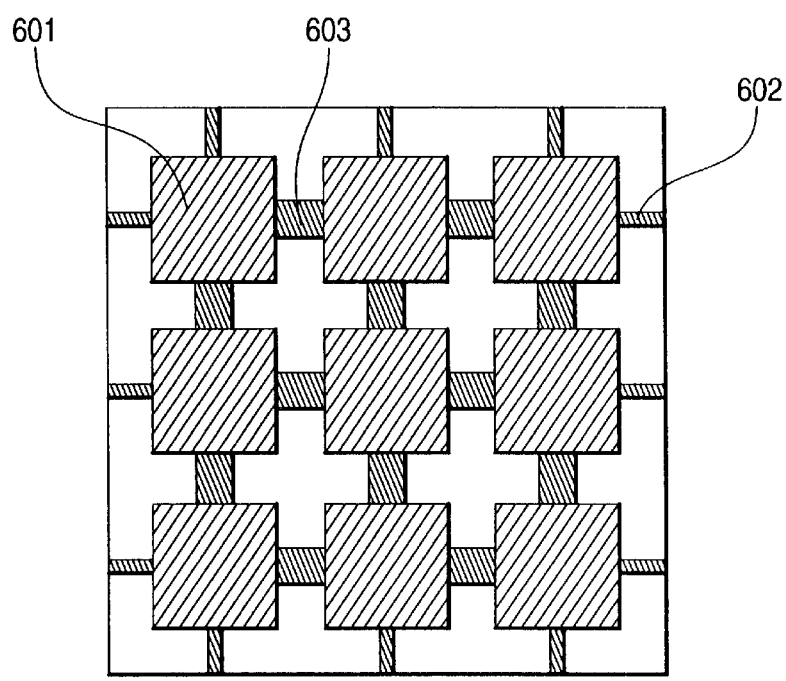
FIGS. 6A and 6B are views showing the constitution of the bonded substrate structure of the invention, in which the through-grooves have different widths.
Figure 6B:
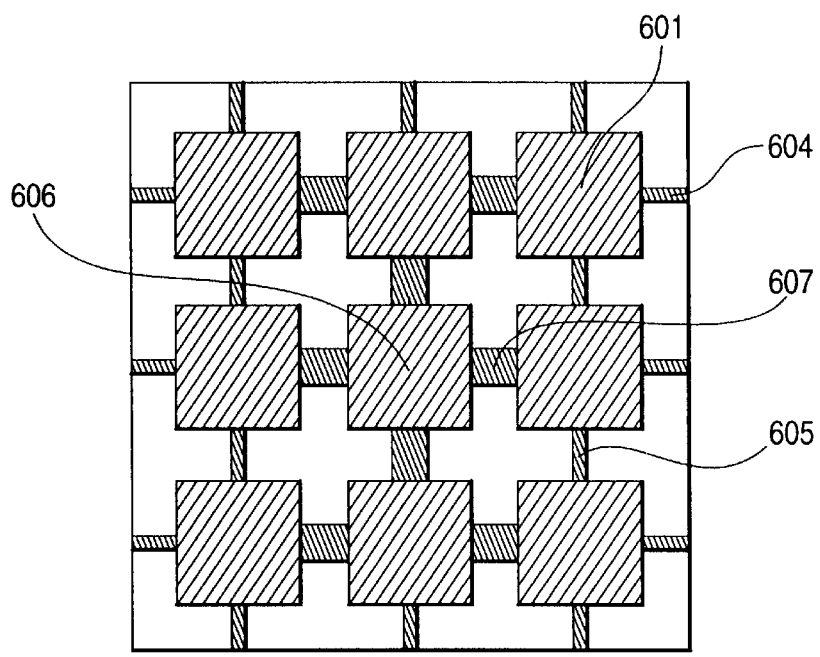

In this embodiment in which one through-groove 404 is formed between one device-housing recess 403 and one edge of the lower substrate 402 to connect them and three through-grooves 404 are formed between the adjacent two device-housing recesses 403 to connect them, the through-grooves 404 thus configured all have the same shape of 2.5 mm (length)×30 μm (width)×10 μm (maximum depth) and their conductance is adjusted. Apart from the configuration illustrated, employable are different configurations as in FIGS. 6A and 6B, in which the width and not the number of the through-grooves is varied to adjust the conductance of the through-grooves FIGS. 6A and 6B are plan views of one substrate of the bonded substrate structure of the invention, in which the device-housing recesses 601 are connected to each other via a through-groove therebetween. In FIG. 6A, the width of the through-groove 602 which connects one device-housing recess 601 to one edge of the substrate differs from that of the through-groove 603 which connects the adjacent two device-housing recesses 601. In this configuration illustrated, for example, the through-groove 602 which connects one device-housing recess 601 to one edge of the substrate may have a width of 30 μm and a maximum depth of 10 μm, and the through-groove 603 which connects the adjacent two device-housing recesses 601 may have a width of 90 μm and a maximum depth of 10 μm. Thus configured, even the device-housing recesses inside the substrate and remoter from the peripheral edge of the substrate will be exposed to little pressure difference from the outside.

In FIG. 6B, not only the through-groove 604 running from the peripheral edge of the substrate but also the through-groove 605 that connect the adjacent two device-housing recesses 601 each being connected to the edge of the substrate by the through-groove 604 are made to have a smaller width, while only the through-groove 607 that connects the two device-housing recesses 606 not adjacent to the edge of the substrate are made to have a larger width. Also in this configuration, the device-housing recesses inside the substrate and remoter from the peripheral edge of the substrate will be exposed to little pressure difference from the outside. Adjusting the conductance of the through-grooves for the fluid running therethrough can be realized not only by varying the width of the through-grooves but also by varying the depth thereof.

In one substrate of the bonded substrate structure of the invention, formed are the through-grooves that connect the device-housing recesses and are open to the outside, as so mentioned hereinabove. In the structure, therefore, the device-housing recesses are kept free from great pressure difference from the outside. Accordingly, when openings are formed through the structure by etching the substrate, the device-housing recesses in the structure are not exposed to rapid pressure change.

In the bonded substrate structure of the invention, the depth of the through-grooves formed in one substrate may be at most 10 μm or so. The through-grooves can be readily formed, for example, through isotropic wet etching with a solution of HF. Therefore, the structure of the invention does not require any deep openings that run though the substrate in the vertical direction, being different from the related art structures. In addition, in the structure of the invention, the width of the through-grooves formed can be enlarged to reduce the depth thereof. Therefore, being different from those constituting the related art structures, the substrates constituting the structure of the invention will be little in trouble of strength reduction.

The invention is not limited to the embodiment mentioned above. The dimension, the material of wafers, the process condition and others can be varied without departing from the spirit and scope of the invention. For example, the through-grooves may be formed in both the two substrates. The devices to be fitted to the structure are not limited to micro-mirrors, but sensors and other various devices are applicable to the structure. The idea of the invention is applicable to all devices having a laminate structure that comprises a plurality of substrates.

Embodiment 2

In Embodiment 1 mentioned above, the depth of the device-housing recesses 403 differs from that of the through-grooves, as in FIGS. 4A to 4C. Precisely, it is seen that the depth of the device-housing recesses 403 differs from that of the through-grooves 404, as in the cross-sectional view of the lower substrate on the right-hand side in FIG. 4B.

In Embodiment 2, the device-housing recesses and the through-grooves are so formed that they have the same depth. For this configuration, the device-housing recesses and also the through-grooves are all formed through one and the same etching operation.

Figure 7A:
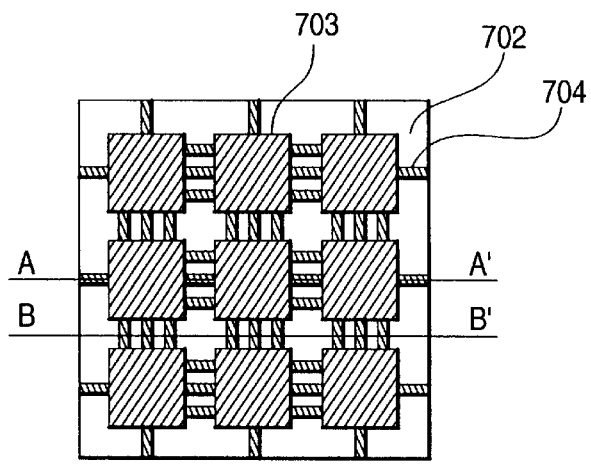
FIGS. 7A to 7C are views for explaining the constitution of the second embodiment of the invention.
Figure 7B:
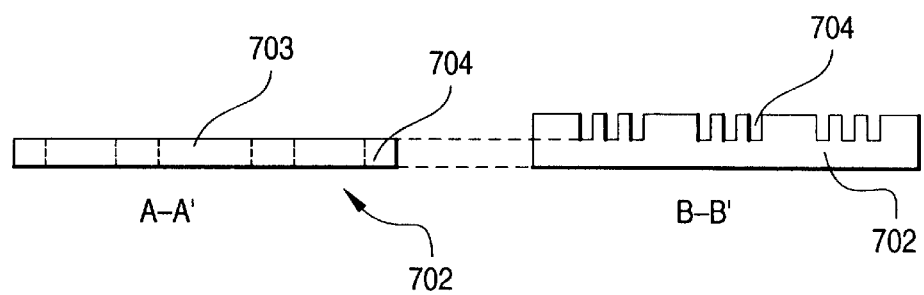
Figure 7C:
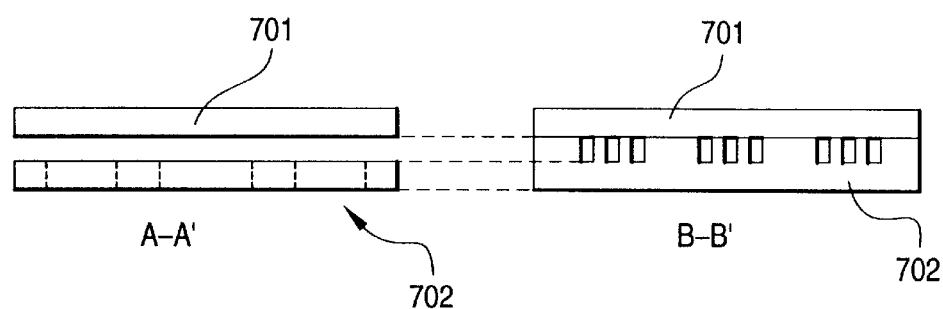

FIGS. 7A to 7C are to explain the constitution of Embodiment 2. Specifically, FIG. 7A is a plan view of a lower substrate to be bonded to an upper substrate; FIG. 7B is an A–A' and B–B' cross-sectional view of the lower substrate; and FIG. 7C is an A–A' and B–B' cross-sectional view of the bonded substrate structure. Though not specifically indicated in any of FIGS. 7A to 7C, the upper substrate is a flat substrate, like in FIG. 4A.

The bonded substrate structure of Embodiment 2 illustrated in FIGS. 7A to 7C is applicable to micro-mirror devices, like in Embodiment 1. The lower substrate 702 shown in FIG. 7A is a Pyrex glass substrate having a size of 40 mm×40 mm×200 μm (thickness), like in Embodiment 1. The lower Pyrex glass substrate 702 has a plurality of device-housing recesses 703 formed therein, and each recess houses a device. Finally, the device blocks are separated into individual ones, and each device block will function as one micro-mirror device. In the embodiment illustrated in FIGS. 7A to 7C, the bonded substrate structure has 3×3=9 device blocks in total, in which these device blocks are formed all at a time. The number of the device blocks to be formed in one substrate shall vary, depending on the necessary area of each device block and the area of the substrate. As the case may be, more device blocks could be formed in the bonded substrate structure. The upper substrate 701 in FIG. 7C is an upper one of the two substrates to be bonded together, and this is an Si substrate. Its surfaces are both polished, and the upper Si substrate 701 has a size of 40 mm×40 mm×60 μm (thickness).

In the embodiment shown in FIGS. 7A to 7C, nine device-housing recesses 703 each having a size of 10 mm×10 mm×20 μm (depth) are formed in the lower Pyrex glass substrate 702, through anisotropic dry etching with $CF_4$ gas, like in Embodiment 1. In each device-housing recess 703, formed is an Al electrode (not shown) for driving a micro-mirror.

In the lower substrate 702, through-grooves 704 are formed in the area in which they connect the device-housing recesses 703 to each other and in the area in which they run to the edge of the substrate. The depth of the through-grooves 704 is the same as that of the device-housing recesses 703. FIG. The A–A' and B–B' cross-sectional view of the constitution of FIG. 7A is in FIG. 7B. The A–A' cross section is of the center region of the substrate, in which the adjacent device-housing recesses 703 are connected to each other by the through-groove 704 therebetween. The height of the A–A' cross section is the same from one end to the other end thereof. On the other hand, the B–B' cross section is of a region of the substrate having only the through-grooves 704 but not the device-housing recesses 703. As in the B–B' cross-sectional view illustrated, the lower substrate 702 has only the through-grooves 704 each having a predetermined depth.

Since the through-grooves 704 have the same depth as the device-housing recesses 703, they can be formed along with the device-housing recesses 703 in the etching step of forming the recesses 703. For example, the through-grooves 704 can be formed along with the device-housing recesses 703 in the process of anisotropic dry etching with $CF_4$ gas for forming nine blocks of the device-housing recesses 703.

In this embodiment, one through-groove 704 is formed between one device-housing recess 704 and one edge of the lower substrate 702 to connect them, and three through-grooves 704 are formed between the adjacent two device-housing recesses 703 to connect them, as in FIG. 7A.

The upper Si substrate 701 is aligned relative to the lower Pyrex glass substrate 702 shown in FIG. 7A, and they are bonded through anodic bonding to each other.

FIG. 7C is a cross-sectional view showing the anodically-bonded substrate structure. The two cross sections of the bonded substrate structure in FIG. 7C correspond to the A–A' and B–B' cross sections in FIG. 7A. As in FIG. 7C, the upper substrate 701 is spaced from the lower substrate 702 via a predetermined space therebetween in the A–A' cross section. The A–A' cross section is of a region of the substrate, in which the through-grooves 704 are aligned alternately with the device-housing recesses 703 from one end to the other end of the substrate, and all the device-housing recesses 703 are connected to the outside via the through-grooves 704 formed therebetween. In this, the depth of all the device-housing recesses 703 is the same as that of all the through-grooves 704. On the other hand, the B–B' cross section is of a region of the substrate not having the device-housing recesses 703 therein. It is understood that only the through-grooves 704 having a predetermined depth are formed in this region.

All the device-housing recesses 703 are connected to each other by the through-grooves 704 therebetween, and are therefore kept connected to the outside. With the through-grooves 704 configured in the manner illustrated, all the device-housing recesses 703 existing in the lower substrate 702 are kept connected to the outside. Therefore, the atmosphere inside the device-housing recesses 703 is kept the same as the outside atmosphere. Accordingly, for example, in case where the upper Si substrate 701 is aligned relative to the lower Pyrex glass substrate 702 and then bonded thereto through anodic bonding at 300 to 400° C. under atmospheric pressure with a voltage of from 0.5 to 1.0 kV being applied to them, and thereafter the region of the upper Si semiconductor substrate around the mirrors fitted thereto is etched away, like in Embodiment 1, the substrates and the beams will not be broken or damaged even when the etching treatment is effected in dry in a vacuum falling between a few mTorr and tens mTorr. This is because the device-housing recesses 703 are connected to the outside via the through-grooves 704 therebetween, and therefore the space of the device-housing recesses 703 is kept having an atmosphere which is the same as the outside atmosphere, or that is, kept having a pressure which is nearly the same as the outside pressure. In that condition, there will be no rapid pressure change in the device-housing recesses 703 even when the recesses are exposed to the etching environment in vacuum.

In this embodiment, the through-grooves 704 have the same depth as the device-housing recesses 703, and therefore can be formed along with the device-housing recesses 703 in the etching step for forming the recesses 703, not requiring an independent step of forming the through-grooves 704.

In this embodiment, the width of the through-grooves may be varied to adjust the conductance thereof for the fluid running through them, like in the configurations illustrated in FIGS. 6A and 6B. Thus configured, the device-housing recesses inside the substrate will be exposed to little pressure difference from the outside.

Embodiment 3

Embodiment 3 is to demonstrate the method for fabricating bonded substrate structures of the invention, in which the through-grooves formed inside the bonded substrate are optionally blocked.

FIGS. 8A to 8F are views for explaining the process for fabricating a bonded substrate structure according to this embodiment. Like in the other embodiments mentioned above, the process of this embodiment is for fabricating micro-mirror devices, but is not limited thereto. The process of this embodiment is applicable not only to micro-mirror devices but also to any other devices, like the processes of the other embodiments mentioned above.

In FIGS. 8A to 8F, the upper and lower substrates may be the same as those in Embodiment 1, or that is, they may be the same as those in FIGS. 4A to 4C. Concretely, the upper substrate 801 is an Si substrate having a size of 40 mm×40 mm×60 μm (thickness), of which both surfaces are polished; and the lower substrate 802 is a Pyrex glass substrate having a size of 40 mm×40 mm×200 μ(thickness). The lower Pyrex glass substrate 802 is processed for forming therein nine blocks of device-housing recesses 803 each having a size of 10 mm×10 mm×20 μm (depth), through anisotropic dry etching with $CF_4$ gas. In each device-housing recess 803, formed is an Al electrode (not shown) for driving a micro-mirror. Finally, the device blocks are separated into individual ones, and each device block will function as one micro-mirror device.

In the lower substrate 802, through-grooves 804 are formed in the area in which they connect the device-housing recesses 803 to each other and in the area in which they run to the edge of the substrate. The through-grooves 804 are formed, for example, through isotropic wet etching with a solution of HF, each having a length of 2.5 mm, a width of 30 μm and a maximum depth of 10 μm.

Figure 8A:
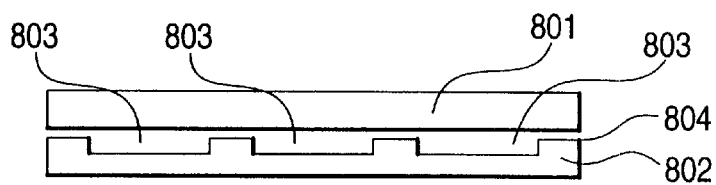
FIGS. 8A to 8F are views for explaining a process for fabricating the bonded substrate structure of the third embodiment of the invention.

FIG. 8A is a cross-sectional view of a bonded substrate structure, for which the upper Si substrate 801 is aligned relative to the lower Pyrex glass substrate 802 and then bonded thereto through anodic bonding, for example, at 300 to 400° C. under atmospheric pressure with a voltage of from 0.5 to 1.0 kV being applied to them.

Figure 8B:
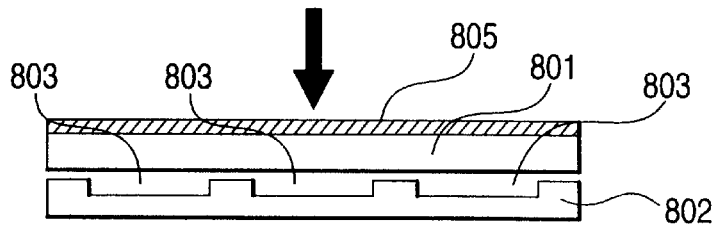
Figure 8C:
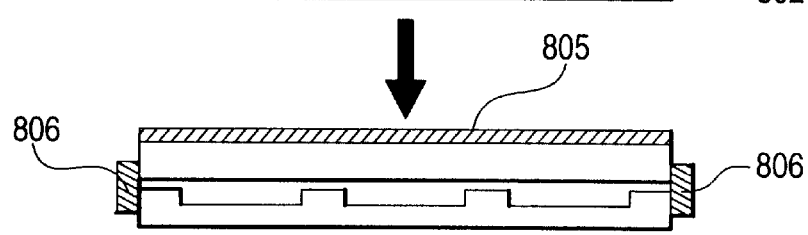

An Al film 805 for micro-mirrors is formed through vapor deposition on the Si substrate 801 of the bonded substrate structure, as in FIG. 8B, and it has a thickness of 200 nm. The Al film 805 functions as a reflective surface of micro-mirrors, and this is formed on the substrate 801 by the use of a vacuum evaporation unit.

If the Al film 805 for micro-mirrors is directly etched as it is, the etchant used will penetrates into the through-grooves 804 and therefore into the device-housing recesses 803. If so, the Al electrode (not shown) in the device-housing recesses 803 will be etched away with the etchant. To evade the problem, a resist layer 806 is formed on the side wall of the bonded substrate structure, as in FIG. 8C. For this, used is a resist pen capable of applying a resist little by little to the side wall. As the case may be, a spray-type resist coater may be used for forming the resist layer 806, with the upper Si substrate 801 being covered with a masking substrate.

Figure 8D:
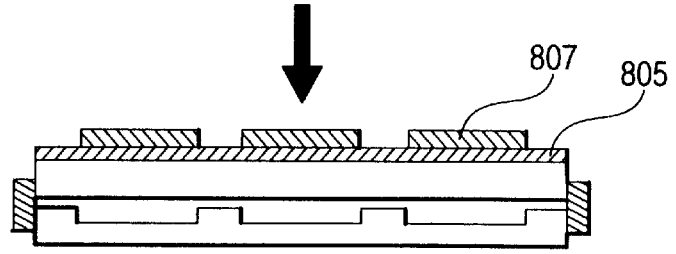
Figure 8E:
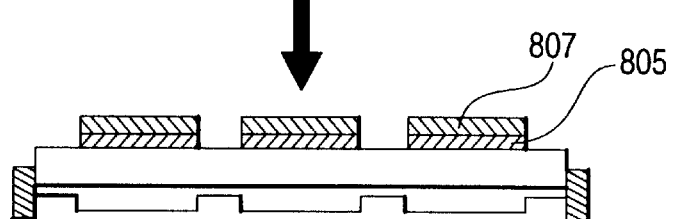
Figure 8F:
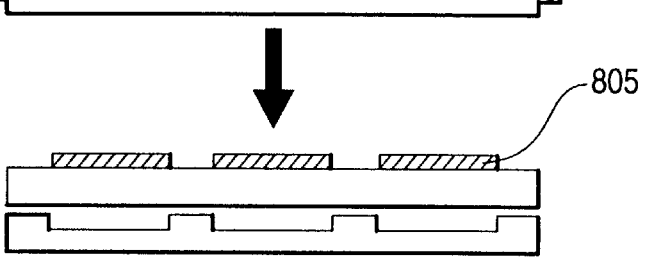

Next, a resist pattern 807 for the reflective surface of micro-mirrors is formed, as in FIG. 8D. The thus-processed substrate structure is then put into a solution of phosphoric acid at 40° C., whereby is formed the Al film 805 for micro-mirrors coated with the resist pattern 807, as in FIG. 8E.

Next, this is processed in an oxygen ashing apparatus (not shown), in which the resist layer 806 on the side wall and the resist pattern 807 are removed. Through the process illustrated, formed is the Al film 805 with a mirror surface for micro-mirrors, as in FIG. 8F. In this process, the Al electrode formed in the device-housing recesses 803 in the Pyrex glass substrate 802 is not damaged.

In the process of fabricating micro-mirrors, each mirror is separated from the box substrate through etching or any other treatment. In this, the resist layer 806 is optionally formed to thereby insulate the device-housing recesses 803 from the outside, or may not be formed to connect them to the outside. Depending on the process environment, therefore, the condition of the device-housing recesses 803 can be kept the best.

According to the process of this embodiment of the invention, a substrate having through-grooves open to the outside may be bonded to another substrate, and the bonded substrate structure may be processed for etching, vapor deposition, resist coating, etc. In the process, the through-grooves may be optionally blocked with a resist to thereby close or open the device-housing recesses in any desired timing, and the atmosphere inside the device-housing recesses can be kept the best for the intended processing steps. Therefore, according to the process of this embodiment for fabricating various devices by the use of substrates having through-grooves therein, the devices housed in the device-housing recesses in the substrates are not damaged, and the yield of the devices fabricated can be increased.

Embodiment 4

This is to demonstrate another embodiment of the bonded substrate structure of the invention and a process for fabricating it, in which the space of the through-grooves formed in one substrate is partly sealed after the substrates have been bonded to each other.

Figure 9A:
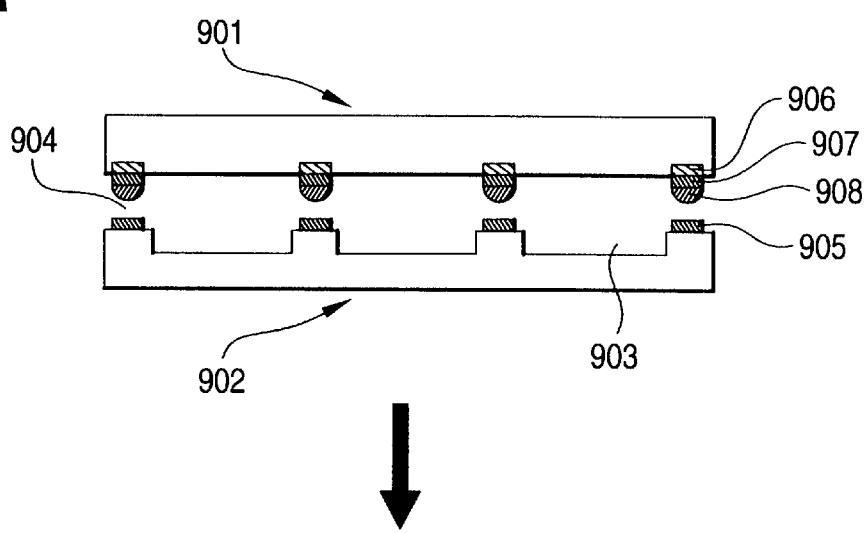
FIGS. 9A and 9B are views showing one mode of sealing the through-grooves in the bonded substrate structure of the fourth embodiment of the invention.
Figure 9B:
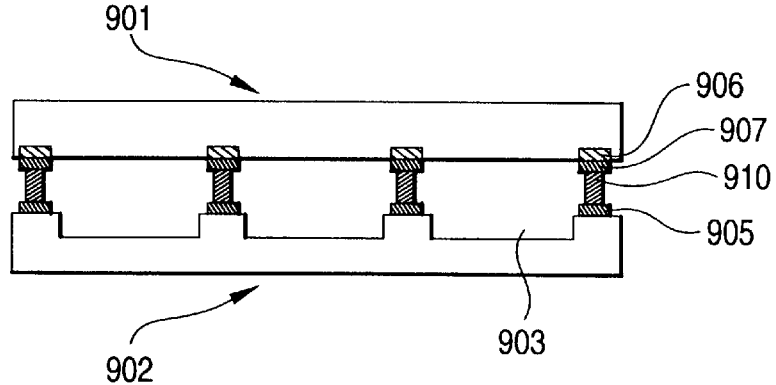

FIGS. 9A and 9B show the constitution of this embodiment. In this embodiment, used are the same upper and lower substrates as in Embodiment 1, or that is, as in FIGS. 4A to 4C. Concretely, the upper substrate 901 is an Si substrate having a size of 40 mm×40 mm 60 μm (thickness), of which both surfaces are polished; and the lower substrate 902 is a Pyrex glass substrate having a size of 40 mm×40 mm×200 μm (thickness). The lower Pyrex glass substrate 902 is processed for forming therein nine blocks of device-housing recesses 903 each having a size of 10 mm×10 mm×20 μm (depth), through anisotropic dry etching with $CF_4$ gas. In each device-housing recess 903, formed is an Al electrode (not shown) for driving a micro-mirror. Finally, the device blocks are separated into individual ones, and each device block will function as one micro-mirror device.

In the lower substrate 902, through-grooves 904 are formed in the area in which they connect the device-housing recesses 903 to each other and in the area in which they run to the edge of the substrate. The through-grooves 904 are formed, for example, through isotropic wet etching with a solution of HF, each having a length of 2.5 mm, a width of 30 μm and a maximum depth of 10 μm.

FIG. 9A shows a cross section, corresponding to the cross section shown by FIG. 4C. Concretely, the cross section of FIG. 9A is of the center region of the bonded substrates, corresponding to the A–A' cross section of the bonded upper and lower substrates shown in FIGS. 4A and 4B. In the center region, three device-housing recesses 903 formed are all connected to each other by the through-groove 904, and the through-groove 904 runs to the both ends of the bonded substrates to be open to the outside.

AS in FIG. 9A, the upper Si substrate 901 is bonded to the lower Pyrex glass substrate 902 through anodic bonding at a substrate temperature of 310° C. and under atmospheric pressure with a voltage of 1.2 kV being applied thereto.

In this embodiment, the through-grooves 904 formed between the bonded upper and lower substrates can be sealed. FIG. 9A is a cross-sectional view of the bonded substrates, in which the through-grooves 904 are not as yet sealed; and FIG. 9B is a cross-sectional view thereof with the through-grooves 904 sealed. Enlarged views corresponding to FIG. 9A and FIG. 9B are in FIG. 10A and FIG. 10B, respectively, in which one through-groove 904 is enlarged. As in FIG. 10A, the cross section of the through-groove 904 is roundish, since the grooves are formed through isotropic etching.

Figure 10A:
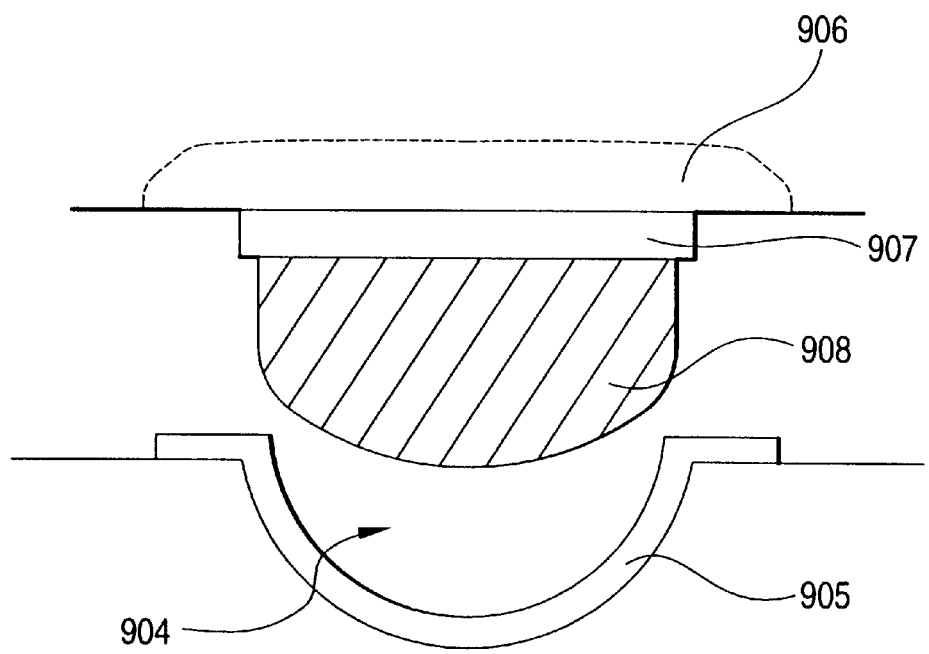
FIGS. 10A and 10B are enlarged views showing the mode of sealing the through-grooves in the bonded substrate structure of the fourth embodiment of the invention.
Figure 10B:
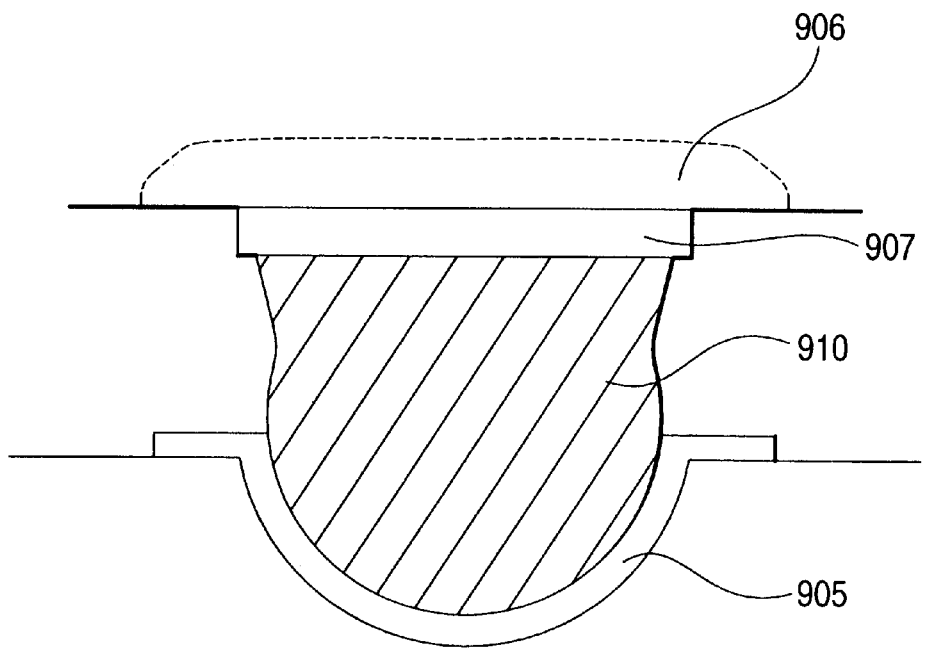

As in FIG. 9A and FIG. 10A, a Cu pad 905 is formed to run over each through groove 904 in the lower substrate 902, according to a lift-off process, and a Cu pad 907 is formed on the surface of the upper Si substrate 901 in the area opposite to the Cu pad 905 also according to a lift-off process. For forming the lift-off pattern of the Cu pads 905 and 907, employable is a resist spraying method in which is formed a uniform resist film even in an area having a difference in level. The Cu pads 905 and 907 both have a length of 150 μm, a width of 32 μm and a thickness of 100 nm.

The Si surface of the upper substrate 901 that is adjacent to the Cu pad 907 on the upper Si substrate 901 is oxidized through exposure to oxygen plasma before the Cu pad 907 is formed thereon, and it forms an $SiO_2$ region 906. The oxygen plasma exposure is effected in a vacuum chamber (not shown) having an $O_2$ concentration of 200 SCCM and a reaction pressure of 300 mTorr with an RF power of 500 W being applied thereto. The $SiO_2$ region 906 has a length of 180 μm and a width of 30 μm. In the step of forming the $SiO_2$ region 906, the area not to be subjected to the plasma is masked with a resist.

A Pb bump 908 is formed according to a lift-off process, in which the center of the bump 908 formed is aligned to that of the Cu pad 907 on the upper Si substrate 901. The Pb bump 908 has a length of 180 μm, a width of 28 μm and a height of 8 μm.

Just after the upper Si substrate 901 has been bonded to the lower Pyrex glass substrate 902 through anodic bonding, the Pb bump 908 is kept adhered to the upper substrate 901 above the through-groove 904 in the lower Pyrex glass substrate 902, as in FIG. 9A and FIG. 10A. In that condition, the through-groove 904 that connects the adjacent device-housing recesses 903 is still open to the outside.

The thus-anodically bonded substrate structure is held on a vacuum stage (not shown), then all the device-housing recesses 903 are completely degassed to be in vacuum, and the vacuum stage is heated so that the temperature of the upper Si substrate 901 thereon could be higher than the melting point (327.5° C. ) of Pb. In that condition, the structure is kept as such for a while, and thereafter the vacuum stage is restored to room temperature. Through the process, the Pb bump 908 comes to be fluid nearly at a temperature above its melting point, and then begins to aggregate toward the high-wettability Cu pad 907 from the low-wettability $SiO_2$ region 906. As a result, the fluid of the Pb bump 908 reaches the Cu pad 905 on the lower Pyrex glass substrate 902, thereby finally sealing the through-groove 904. After the vacuum stage is cooled, the Pb fluid is solidified to form a stopper of Pb, or that is, a sealing stopper 910, as in FIG. 9B and FIG. 10B. In that condition, each device-housing recess 903 is kept in vacuum owing to the sealing stopper 910.

Figure 11A:
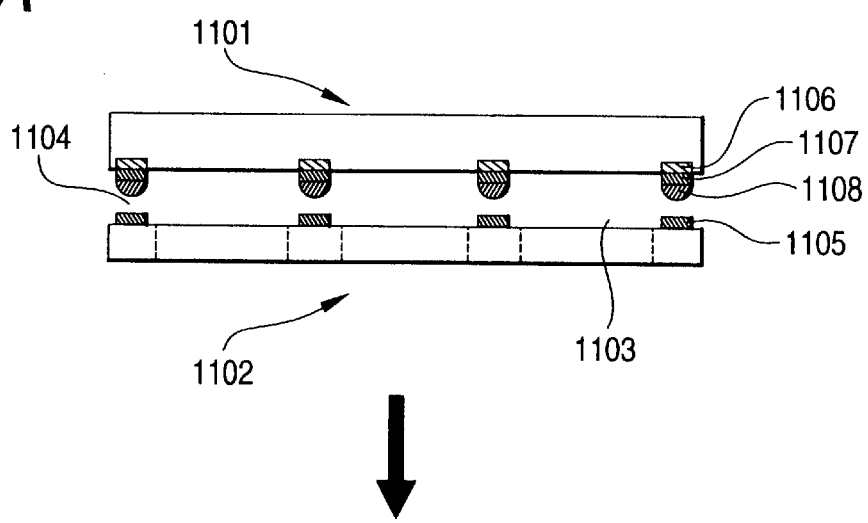
FIGS. 11A and 11B are views showing another mode of sealing the through-grooves in the bonded substrate structure of the fourth embodiment of the invention, in which the device-housing recesses and the through-grooves have the same depth.
Figure 11B:
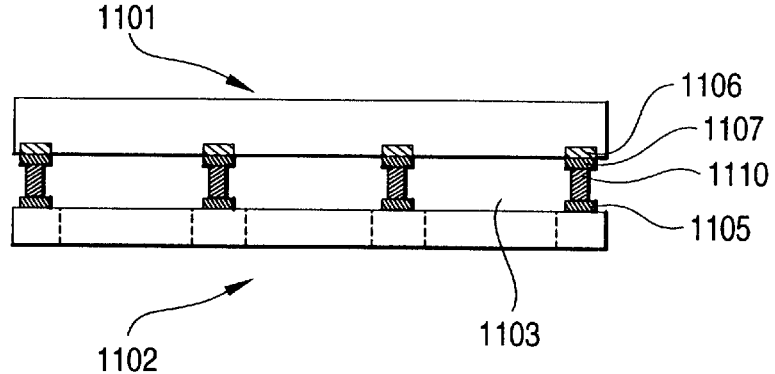

In the constitution shown in FIGS. 9A and 9B, the lower substrate is configured in the same manner as in Embodiment 1, or that is, the depth of the through-grooves 904 differs from that of the device-housing recesses 903. However, this embodiment of sealing through-grooves is not limited to only the configuration illustrated, but is applicable to any other configurations. For example, it is applicable to a different configuration, in which the depth of the through-grooves 904 is the same as that of the device-housing recesses 903, as in Embodiment 2. The sealing process for the configuration is illustrated in FIGS. 11A and 11B, in which the depth of the through-grooves 1104 is the same as that of the device-housing recesses 1103. FIG. 11A is a cross-sectional view of the bonded substrates, in which the through-grooves 1104 are not as yet sealed; and FIG. 11B is a cross-sectional view thereof with the through-grooves 1104 sealed.

FIG. 11A shows a cross section, corresponding to the cross section shown by the left-hand view of FIG. 7C. Concretely, the cross section of FIG. 11A is of the center region of the bonded substrates, corresponding to the A–A' cross section of the bonded upper and lower substrates shown in FIG. 7A. In the center region, three device-housing recesses 1103 formed are all connected to each other by the through-groove 1104, and the through-groove 1104 runs to the both ends of the bonded substrates to be open to the outside.

The constitution shown by FIGS. 11A and 11B is the same as that shown by FIGS. 9A and 9B, except that the surface configuration of the lower substrate 1102 in the former differs from that of the lower substrate 902 in the latter. Concretely, a Cu pad 1105 is formed to run over each through groove 1104 in the lower substrate 1102, and a Cu pad 1107 is formed on the surface of the upper Si substrate 1101 in the area opposite to the Cu pad 1105.

The Si surface of the upper substrate 1101 that is adjacent to the Cu pad 1107 on the upper Si substrate 1101 is oxidized through exposure to oxygen plasma before the Cu pad 1107 is formed thereon, and it forms an $SiO_2$ region 1106. A Pb bump 1108 is formed with its center being aligned to the center of the Cu pad 1107 on the upper Si substrate 1101.

The anodically bonded substrate structure of FIG. 11A is held on a vacuum stage (not shown), then all the device-housing recesses 1103 are completely degassed to be in vacuum, and the vacuum stage is heated so that the temperature of the upper Si substrate 1101 thereon could be higher than the melting point (327.5° C.) of Pb. In that condition, the structure is kept as such for a while, and thereafter the vacuum stage is restored to room temperature. Through the process, the Pb bump 1108 comes to be fluid nearly at a temperature above its melting point, and then begins to aggregate toward the Cu pad 1107 from the low-wettability $SiO_2$ region 1106. As a result, the fluid of the Pb bump 1108 reaches the Cu pad 1105 on the lower Pyrex glass substrate 1102, thereby finally sealing the through-groove 1104. After the vacuum stage is cooled, the Pb fluid is solidified to form a stopper of Pb, or that is, a sealing stopper 1110, as in FIG. 11B. In that condition, each device-housing recess 1103 is kept in vacuum owing to the sealing stopper 1110.

According to the process of sealing the through-grooves herein illustrated with reference to FIGS. 9 to 11, formed are different types of sealed through-groove arrangements, for example, as in FIGS. 12A and 12B.

Figure 12A:
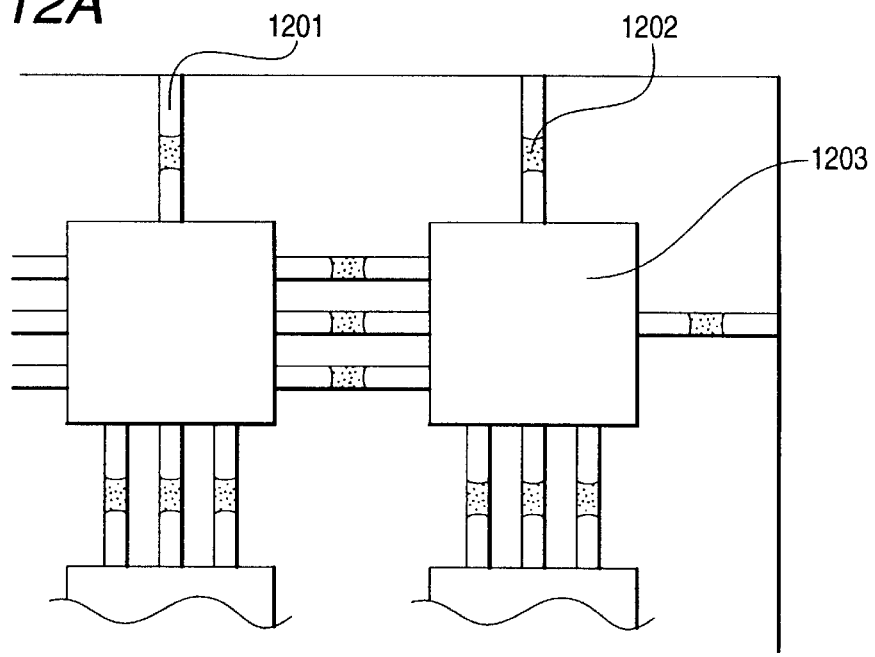
FIGS. 12A and 12B are views showing different modes of sealing the through-grooves in the bonded substrate structure of the fourth embodiment of the invention.
Figure 12B:
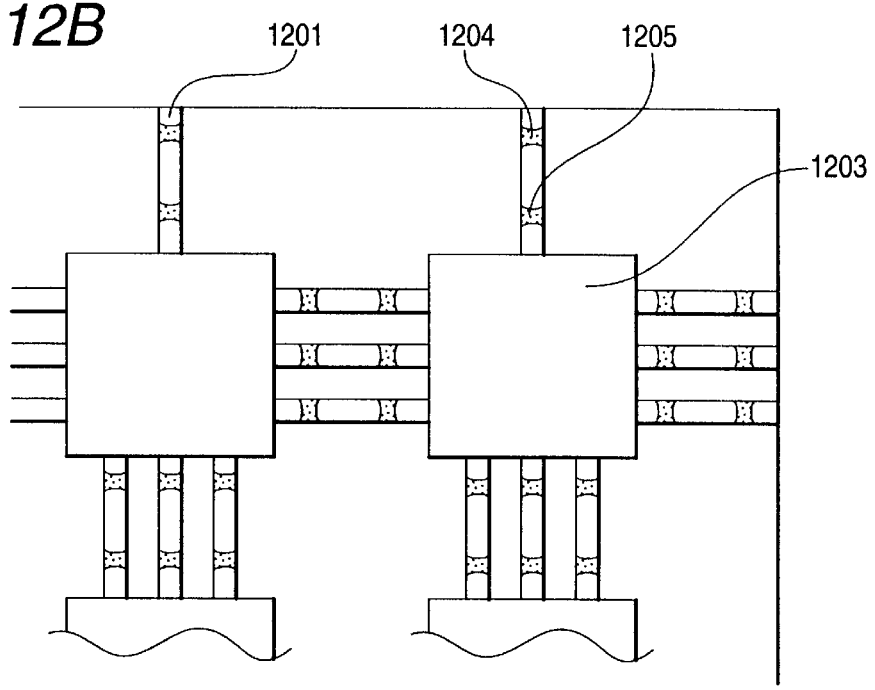

In the configuration of FIG. 12A, a Pb bump such as that in FIG. 10A is formed nearly in the center region of each through-groove 1201, and this is melted to form a sealing member 1202 in each through-groove 1201. In the configuration of FIG. 12B, two Pb bumps are formed in each through-groove 1201, while being spaced from each other via a predetermined distance therebetween, and these are individually melted to form two sealing members 1204 and 1205 in each through-groove 1201.

For separating the devices aligned in the configuration as in FIG. 12A from each other, they may be cut off at the center of each sealing member 1202. In each device thus separated in that manner, the device-housing recess 1203 is kept sealed. On the other hand, the devices aligned in the configuration as in FIG. 12B where each through-groove 1201 is sealed in two sites by different two sealing members 1204 and 1205, could be separated from each other by cutting off them in any desired site between the two sealing members 1204 and 1205. In each device thus separated, the device-housing recess 1203 is kept sealed.

According to the technique of sealing through-grooves of this embodiment, the atmosphere inside each device-housing recess can be kept sealed in vacuum or under a predetermined pressure in any desired stage of the process of fabricating devices, and the atmosphere inside the thus-sealed device-housing recesses is protected from any outside pressure change in the subsequent steps of further processing the devices since the sealed device-housing recesses are not exposed to any outside atmosphere change in the subsequent steps.

The embodiment concretely illustrated herein is essentially for sealing the through-grooves in a process of fabricating micro-mirror devices, but the invention is not limited thereto. The material of wafers to be processed and also the process condition including processing temperatures and others can be varied without departing from the spirit and scope of the invention. For example, the step of sealing through-grooves may be effected in a predetermined inert gas atmosphere. In this case, the sealed device-housing recesses shall be purged with the inert gas used. In the embodiment illustrated, Pb is used as the sealing material. Apart from this, herein usable is any other material of which the melting point is lower than the melting point of the substrates, including, for example, solder (PbSn), thermoplastic resins, etc. In addition, further usable are other various materials of metals, alloys, resins, etc. In the embodiment illustrated, the sealing material such as Pb is fitted to the upper substrate opposite to each through-groove. Apart from the case, the sealing material may be fitted to a suitable site of each through-groove to partly seal the site, for which the upper substrate shall be suitably aligned relative to each through-groove to be sealed. As the case may be, sealing the through-grooves may be effected prior to anodically bonding the upper and lower substrates. In this case, the bonded substrate structure could be etched and processed in the subsequent steps with the device-housing recesses being sealed. The upper and lower substrates may be bonded to each other through ordinary room-temperature bonding and not through anodic bonding, for which sealing materials having a lower melting point could be used.

While the invention has been described in detail and with reference to specific embodiments thereof, it will be apparent to one skilled in the art that various changes and modifications can be made therein without departing from the spirit and scope thereof. The embodiments described herein are to concretely illustrate the invention, but are not to restrict the scope of the invention.

In the embodiments described hereinabove, a semiconductor substrate is combined with a glass substrate, but the combination is not limitative in the invention. The invention is applicable also to a combination of semiconductor substrates to be bonded to each other, and even to a combination of three or more layers of substrates and not to only the combination of two layers of substrates. Needless-to-say, the embodiments individually described hereinabove can be combined, and the combinations are within the scope of the invention. To reasonably understand the subject matter of the invention, the description of the claims to be described hereinunder shall be taken into consideration.

According to the bonded substrate structures and the method for fabricating them of the invention, a through-groove that connects the adjacent device-housing recesses and is open to the outside is formed in at least one bonded substrate. In these bonded substrate structures, the atmosphere inside the device-housing recesses is not exposed to any extreme pressure difference from the outside, and the device-housing recesses are not exposed to any rapid pressure change while the structure is etched to form openings therethrough. In addition, the structures of the invention do not require deep openings that run through them in the vertical direction, dislike the related art structures. Therefore, the process of fabricating the structures of the invention is simplified, and the strength of the bonded substrates in the structures of the invention is not lowered.

Moreover, in the bonded substrate structures and according to the method for fabricating them of the invention, the depth of the through-grooves may be the same as that of the device-housing recesses. To fabricate the structures of that type, the through-grooves can be formed in one and the same etching treatment for forming the device-housing recesses, and the process of fabricating them is further simplified.

Further, in the bonded substrate structures and according to the method for fabricating them of the invention, a resist may be optionally formed around the outer peripheral edge of the bonded substrates. With the resist thus formed, the through-grooves may be blocked before the bonded substrates are subjected to the subsequent steps of etching, vapor deposition, resist coating, etc. Accordingly, in the process of processing the bonded substrates, the through-grooves may be optionally blocked with a resist to thereby close or open the device-housing recesses in any desired timing, and the atmosphere inside the device-housing recesses can be kept the best for the intended processing steps. Therefore, according to the process of this embodiment for fabricating various devices by the use of substrates having through-grooves therein, the devices housed in the device-housing recesses in the substrates are not damaged, and the yield of the devices fabricated can be increased.

Furthermore, in the bonded substrate structures and according to the method for fabricating them of the invention, the through-grooves may be sealed, for example, with a Pb bump or the like. According to the technique of sealing the through-grooves in the bonded substrate structures, the atmosphere inside each device-housing recess can be kept sealed in vacuum or under a predetermined pressure in any desired stage of the process of fabricating devices, and the atmosphere inside the thus-sealed device-housing recesses is protected from any outside pressure change in the subsequent steps of further processing the devices since the sealed device-housing recesses are not exposed to any outside atmosphere change in the subsequent steps. The embodiment of the invention makes it possible to remove the limitations in the process of fabricating bonded substrate structures having through-grooves formed therein.

What is claimed is:

1. A bonded substrate structure, comprising:
a plurality of substrates being bonded together, wherein at least one bonded substrate is so constituted that the substrate's bonded surface has a groove extending inwardly from its peripheral edge, wherein the groove connects with a device-housing recess formed in at least one bonded substrate and is open thereto.

2. The bonded substrate structure as claimed in claim 1, wherein the groove connects with a device-housing recess formed in at least one bonded substrate and is open thereto so that an atmosphere outside the bonded substrate structure can be kept nearly the same as an atmosphere inside the device-housing recess via the groove.

3. The bonded substrate structure as claimed in claim 1, wherein the bonded surface of at least one substrate has the device-housing recess and the groove, and the device-housing recess and the groove have nearly the same depth.

4. The bonded substrate structure as claimed in claim 1, wherein at least one bonded substrate has a plurality of device-housing recesses corresponding to a plurality of devices, the groove is configured to comprise a plurality of grooves connecting the device-housing recesses to each other, and the grooves formed inside the bonded substrate and remoter from the peripheral edge thereof are made to have a larger conductance for a fluid running therethrough than those formed adjacent to the peripheral edge of the bonded substrate.

5. The bonded substrate structure as claimed in claim 4, wherein a cross-sectional area of the grooves formed inside the bonded substrate is made larger than that of the grooves formed adjacent to the peripheral edge of the bonded substrate to thereby adjust a conductance of the grooves for the fluid running through them.

6. The bonded substrate structure as claimed in claim 4, wherein a number of the formed inside the bonded substrate is made larger than that of the grooves formed adjacent to the peripheral edge of the bonded substrate to thereby adjust a conductance of the grooves for the fluid running through them.

7. The bonded substrate structure as claimed in claim 4, wherein a width of the grooves formed inside the bonded substrate is larger than that of the grooves formed adjacent to the peripheral edge of the bonded substrate to thereby adjust a conductance of the grooves for the fluid running through them.

8. The bonded substrate structure as claimed in claim 4, wherein a depth of the grooves formed inside the bonded substrate is larger than that of the grooves formed adjacent to the peripheral edge of the bonded substrate to thereby adjust a conductance of the grooves for the fluid running through them.

9. The bonded substrate structure as claimed in claim 1, wherein the groove is connected to the device-housing recess, and has therein a sealing member that insulates the device-housing recess from the outside to keep the device-housing recess sealed.

10. The bonded substrate structure as claimed in claim 9, wherein the sealing member is formed by melting a sealing substance in the groove or on a surface opposite to the groove.

11. The bonded substrate structure as claimed in claim 10, wherein the sealing member in the groove is provided with a pad member having high wettability with the sealing substance, and the sealing substance is, when melted, aggregated in an area of the high wettability pad member to seal the groove.

12. The bonded substrate structure as claimed in claim 10, wherein the sealing substance is lead.

13. The bonded substrate structure as claimed in claim 10, wherein the sealing substance is any of a metal, an alloy or a resin.

14. The bonded substrate structure as claimed in claim 9, wherein only one sealing member is formed per groove.

15. The bonded substrate structure as claimed in claim 9, wherein a plurality of sealing members are formed in the groove and are spaced from each other therein.

16. The bonded substrate structure as claimed in claim 1, which is a micro-mirror device having a movable mirror supported by means of beams on one substrate and having, on the other substrate, an electrode for driving the movable mirror.

* * * * *